United States Patent
Lee et al.

(10) Patent No.: US 9,948,296 B2
(45) Date of Patent: *Apr. 17, 2018

(54) CONDUCTIVE FILM OF A TOUCH PANEL AND MANUFACTURING METHOD THEREOF

(71) Applicant: TPK TOUCH SOLUTIONS (XIAMEN) INC., Xiamen (CN)

(72) Inventors: Yuh-Wen Lee, Zhubei (TW); Xianbin Xu, Xiamen (CN); Keming Ruan, Ningde (CN); Fengming Lin, Fuzhou (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/572,800

(22) Filed: Dec. 17, 2014

(65) Prior Publication Data
US 2015/0101920 A1    Apr. 16, 2015

Related U.S. Application Data

(62) Division of application No. 13/846,972, filed on Mar. 19, 2013, now Pat. No. 8,976,152.

(51) Int. Cl.
*H03K 17/96* (2006.01)
*G06F 3/041* (2006.01)
(Continued)

(52) U.S. Cl.
CPC ......... *H03K 17/9618* (2013.01); *G06F 3/044* (2013.01); *G06F 3/0412* (2013.01); *H05K 3/1208* (2013.01); *G06F 2203/04103* (2013.01); *H03K 2017/9613* (2013.01); *H03K 2217/96015* (2013.01); *H05K 1/0287* (2013.01); *H05K 2203/0117* (2013.01); *H05K 2203/1173* (2013.01)

(58) Field of Classification Search
CPC ....... H03K 17/9618; H03K 2017/9613; H03K 2217/96015; G06F 3/041; G06F 3/0412; G06F 3/044; G06F 3/0488; G06F 2203/04103; G06F 2203/04111; G06F 2203/04112; G02F 1/13338; H05K 1/09; H05K 1/0287; H05K 3/1208; H05K 2203/0117; H05K 2203/1173
See application file for complete search history.

(56) References Cited

U.S. PATENT DOCUMENTS 6,162,569 A * 12/2000 Nakashima ....... G02F 1/133516
                                                            205/120
7,749,556 B2 * 7/2010 Li ........................... H01J 9/025
                                                            313/292
(Continued)

*Primary Examiner* — Tom Sheng
(74) *Attorney, Agent, or Firm* — Paul David Bendemire

(57) ABSTRACT

The present disclosure provides a conductive film of a touch panel. The conductive film has a film and a plurality of a plurality of hydrophobic units. The film is used for sensing touch signals, and the hydrophobic units are disposed in the film with intervals. Conductive material of the conductive film of the touch panel is distributed outside the region of the hydrophobic units, and as the hydrophobic units have good light transmittance, the touch panel of the present disclosure has a characteristic of high light transmittance.

14 Claims, 11 Drawing Sheets

(51) Int. Cl.
*G06F 3/044* (2006.01)
*H05K 3/12* (2006.01)
*H05K 1/02* (2006.01)

(56) References Cited

U.S. PATENT DOCUMENTS

| | | | | |
|---|---|---|---|---|
| 8,976,152 B2* | 3/2015 | Lee | ........................ | G06F 3/0412 |
| | | | | 345/174 |
| 2003/0170454 A1* | 9/2003 | Lamotte | ................. | H01B 1/127 |
| | | | | 428/396 |
| 2006/0183342 A1* | 8/2006 | Bruyns | .................... | H05K 3/02 |
| | | | | 438/768 |
| 2006/0244886 A1* | 11/2006 | Hirai | ................ | G06K 19/07749 |
| | | | | 349/139 |
| 2011/0097514 A1* | 4/2011 | Shin | ..................... | C09D 11/102 |
| | | | | 427/555 |
| 2011/0227867 A1* | 9/2011 | Ogawa | .................... | G06F 3/044 |
| | | | | 345/174 |
| 2012/0098791 A1* | 4/2012 | Hamada | .................. | G06F 3/044 |
| | | | | 345/174 |
| 2012/0231248 A1* | 9/2012 | Sato | ....................... | B32B 27/308 |
| | | | | 428/213 |
| 2013/0092426 A1* | 4/2013 | Wu | ......................... | H01L 24/29 |
| | | | | 174/257 |

* cited by examiner

-- Prior Art --

-- Prior Art --

-- Prior Art --

CONDUCTIVE FILM OF A TOUCH PANEL AND MANUFACTURING METHOD THEREOF

CROSS-REFERENCE TO RELATED APPLICATIONS

This application is a divisional of Prior application Ser. No. 13/846,972, filed on Mar. 19, 2013, which claims the benefit of the People's Republic of China Application No. 201210076695.2, filed on Mar. 21, 2012 by the present inventor, the disclosure of which are incorporated herein by reference.

BACKGROUND OF THE INVENTION

Field of the Invention

The present disclosure relates to a touch panel. More particularly, the present disclosure relates to a conductive film of a touch panel and a method of manufacturing the same.

Description of the Related Art

Touch panel devices are widely used in day to day life. A touch panel is typically integrated with a display panel, wherein a user can control an electronic device to execute a corresponding command by touching the display panel. At present, a conductive film that is typically used for a touch panel is an indium tin oxide (short for ITO) film, which can be formed on a transparent insulating substrate such as glass plate or polyethylene terephthalate (short for PET) plate.

With reference to FIG. 1A, FIG. 1B, and FIG. 1C, FIG. 1A is a stereogram of a conductive film of a traditional touch panel, FIG. 1B is a plan view of a conductive film of a traditional touch panel, and FIG. 1C is a section view of a conductive film of a traditional touch panel along a section line AA. As shown in FIG. 1A, FIG. 1B and FIG. 1C, a conductive film 11 is overlaid on a substrate 12 before patterning is conducted based on the designed electrode patterns. Since material of the conductive film 11, which comprises of ITO and like materials, absorbs light, light transmittance of a traditional touch panel formed by overall overlaying the conductive film 11 is poor. At present, conductive films can also be formed of conductive polymers, carbon nanotubes (CNT in short), or Ag nanowires. The conductive polymers, carbon nanotubes, or Ag nanowires and the like materials have stronger absorption rate and lower transmittance rate. Therefore, light transmittance of touch panels having conductive films that are made of the above mentioned materials is dramatically reduced.

In the current technology, a conductive film formed of ITO can be hollowed out by a common patterning process to increase light transmittance thereof. However, a conductive film formed of conductive polymer is hard to apply with the common patterning process because of the property of the conductive polymer. In addition, the above method adds an additional patterning process such that the manufacturing cost of the touch panel is increased. Accordingly, providing a conductive film of a touch panel having high light transmittance and a simple method of manufacturing the conductive film of the touch panel becomes a technical difficulty for those skilled in the art to solve.

SUMMARY OF THE INVENTION

The present disclosure provides a conductive film of a touch panel, wherein the conductive film of the touch panel comprises a film and a plurality of hydrophobic units. The film is used for sensing touch signals, and the hydrophobic units are disposed in the film with intervals. The hydrophobic units have good light transmittance, thereby increasing light transmittance of the conductive film of the touch panel.

An embodiment of the present disclosure provides an electrode layer of a touch panel, wherein the electrode layer comprises a plurality of electrodes and a plurality of hydrophobic units. The electrodes are formed of the patterned conductive film, and the hydrophobic units are disposed in the electrodes with intervals. The hydrophobic units have good light transmittance, thereby efficiently increasing light transmittance of the electrode layer of the touch panel.

An embodiment of the present disclosure provides a touch panel having a conductive film with high light transmittance, wherein the touch panel comprises a substrate and an electrode layer disposed on the substrate. The electrode layer comprises a plurality of electrodes and a plurality of conducting wires, wherein the electrodes are formed of a patterned conductive film, and wherein the conducting wires are electrically connected with the electrodes. A plurality of hydrophobic units are disposed in the electrodes with intervals. Therefore, the touch panel has high light transmittance to sense users' touch.

An embodiment of the present disclosure provides a method of manufacturing a conductive film of a touch panel, wherein the method comprises: forming a plurality of hydrophobic units; and forming a film for sensing touch signals, wherein the hydrophobic units are disposed in the film with intervals. Accordingly, the conductive film of the touch panel can efficiently increase light transmittance because of the hydrophobic units that have good light transmittance.

According to the foregoing embodiments, the conductive film of the touch panel provided and manufactured by the present disclosure has a plurality of hydrophobic units, thereby having greater light transmittance.

DETAILED DESCRIPTION OF THE EMBODIMENTS

In order to further understand characteristics and technical aspects of the present disclosure, several descriptions accompanied with drawings are described in detail below. However, descriptions and accompanying drawings are for the purposes of reference and specification only, and do not limit the scope of the present disclosure in any manner.

Figure 1A:
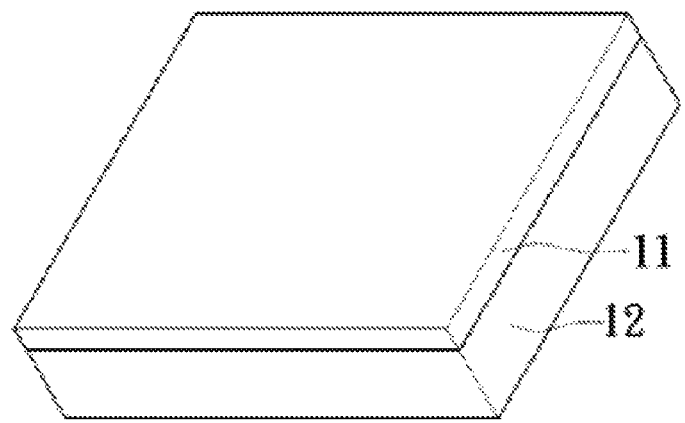
FIG. 1A is a stereogram of a conductive film of a traditional touch panel.
Figure 1B:
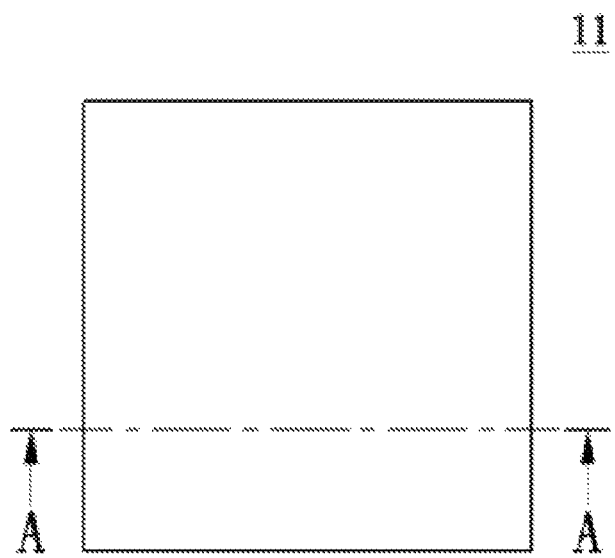
FIG. 1B is a plan view of a conductive film of a traditional touch panel.
Figure 1C:
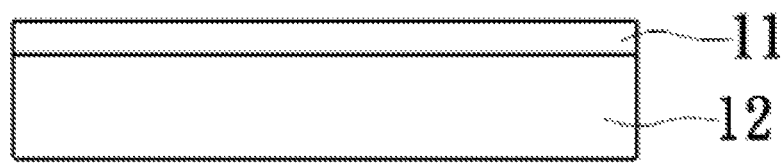
FIG. 1C is a section view of a conductive film of a traditional touch panel along a section line AA.
Figure 2A:
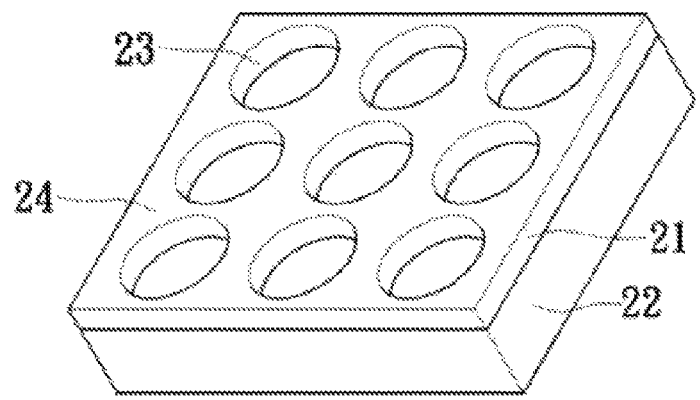
FIG. 2A is a stereogram of a conductive film in accordance with an embodiment of the present disclosure.
Figure 2B:
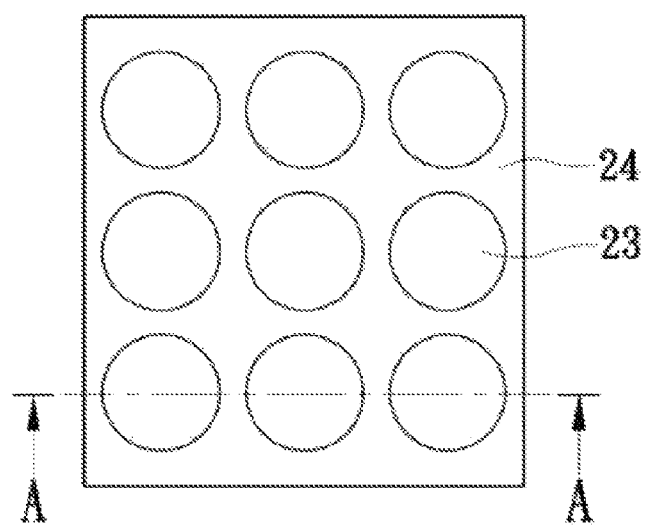
FIG. 2B is a plan view of a conductive film of a touch panel in accordance with another embodiment of the present disclosure.

With reference to FIG. 2A and FIG. 2B, FIG. 2A is a stereogam of a conductive film in accordance with an embodiment of the present disclosure and FIG. 2B is a plan view of a conductive film of a touch panel in accordance with another embodiment of the present disclosure. As shown in FIG. 2A and FIG. 2B, a conductive film 21 of a touch panel comprises a film 24 used for sensing touch signals and a plurality of hydrophobic units 23, wherein the hydrophobic units 23 are disposed in the film 24 with intervals, such that the conductive film 21 of the touch panel has high light transmittance. The hydrophobic units 23 have good light transmittance, such that light transmittance of the conductive film 21 of the touch panel is efficiently increased.

Figure 2C:
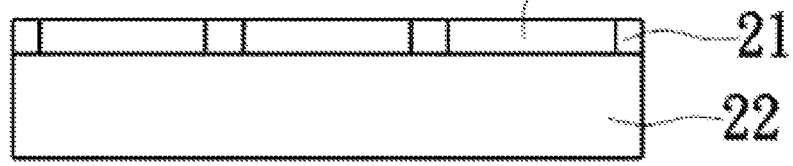
FIG. 2C is a section view of a conductive film of a touch panel in accordance with another embodiment of the present disclosure along a section line AA.

Further with reference to FIG. 2C, FIG. 2C is a section view of a conductive film of a touch panel in accordance with another embodiment of the present disclosure along a section line AA. As shown in FIG. 2C, the conductive film 21 of the touch panel is formed on a substrate 22, wherein the substrate 22 can be a transparent insulating substrate, such as glass plate, ceramic plate, plastic plate, polyethylene terephthalate (PET) plate, or a flexible substrate or a substrate formed of any other applicable materials.

In an embodiment, the hydrophobic units 23 can be formed by patterning a hydrophobic material. The film 24 can be a transparent film made of a water soluble conductive material. Particularly, the hydrophobic material can be overlaid on the substrate 22 in advance, and a plurality of hydrophobic units 23 can be formed by a patterning process such as screen printing, inkjet printing or lithography/etching and the like. The water-soluble conductive solution containing the water-soluble conductive material can then be allocated on the substrate 22, and after the substrate 22 is baked, the conductive film 21 of the touch panel can be formed. Since material of the hydrophobic units 23 is hydrophobic, which can prevent the water soluble conductive material from distributing to the region where the hydrophobic units 23 are located, the water-soluble conductive material can only cover the substrate 22 outside the region of the hydrophobic units 23 to form the film 24.

Figure 3A:
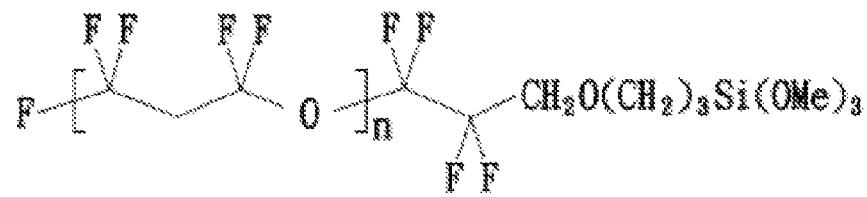
FIG. 3A to FIG. 3D respectively illustrate schematic views of chemical structural formulas for different anti-fingerprint coatings in accordance with another embodiment of the present disclosure.
Figure 3B:
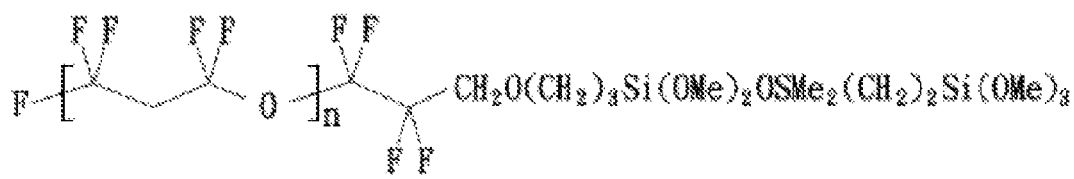
Figure 3C:
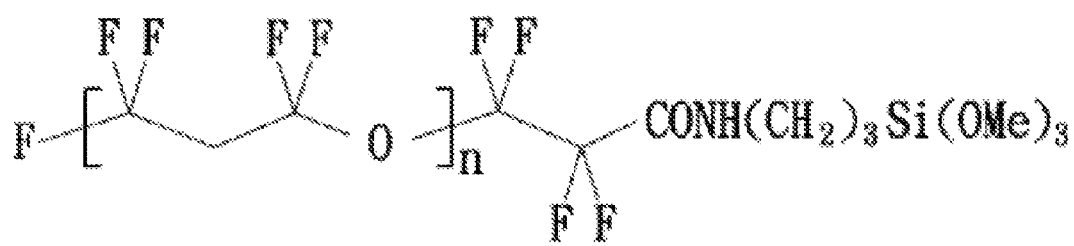
Figure 3D:
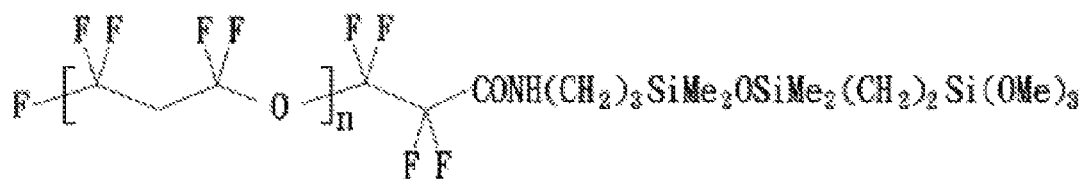
Figure 4A:
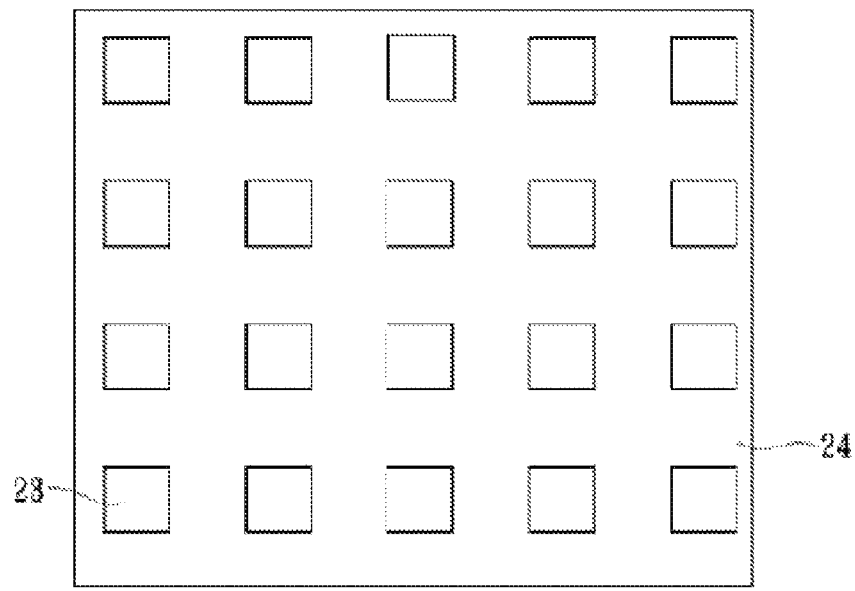
FIG. 4A to 4E are respectively schematic views of different shapes of hydrophobic units in accordance with another embodiment of the present disclosure.
Figure 4B:
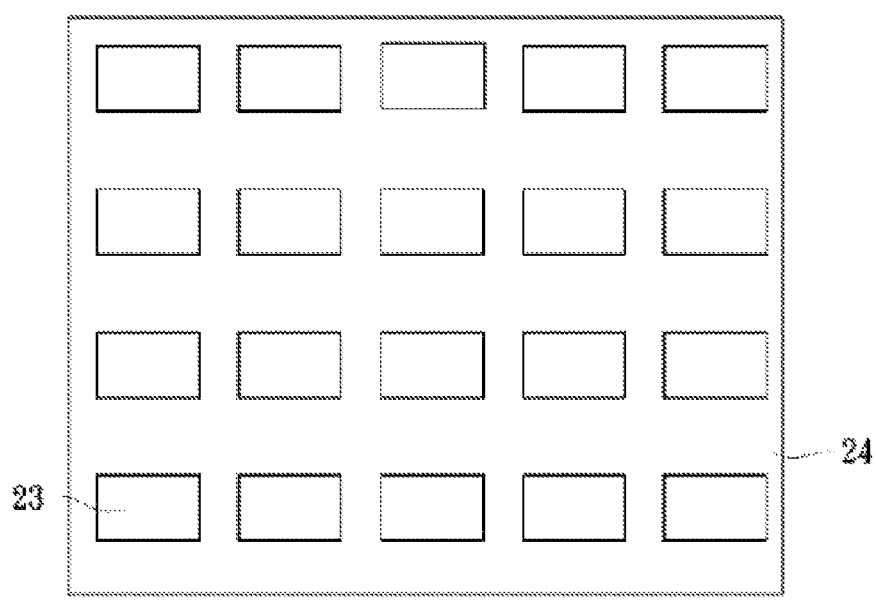
Figure 4C:
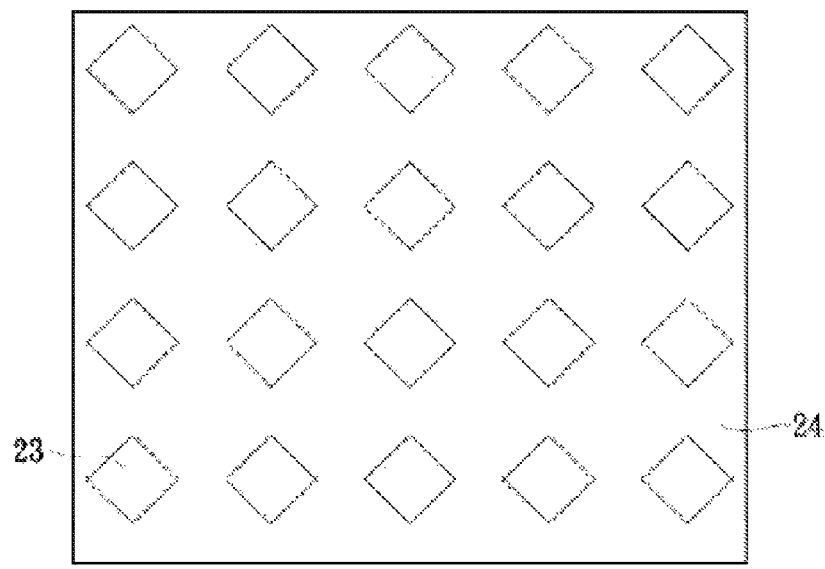
Figure 4D:
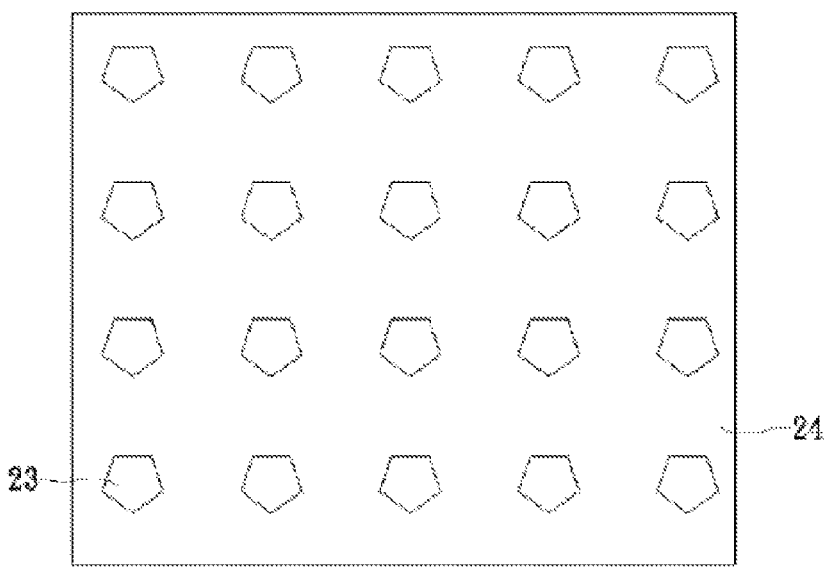
Figure 4E:
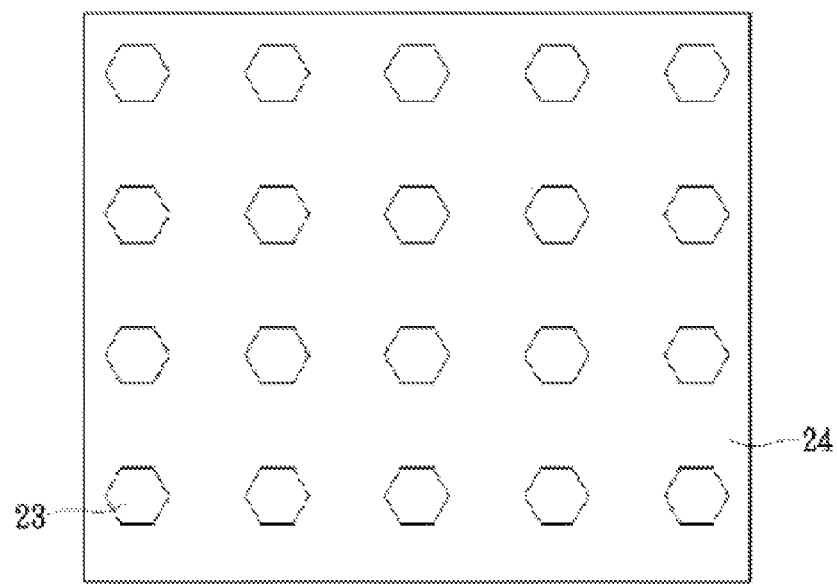

It is to be noted that the foregoing hydrophobic material is at least one of anti-fingerprint coating (AF), parting agent, release agent, silicone oil and silicone, but it is not limited thereto. Anti-fingerprint coating belongs to a fluorocarbon, and general formula of the fluorocarbon is $F(C_3HOF_4)nC_2F_4(CH_2)mO(CH_2)aSi(OR)_3$, wherein m and a can be an integer from 1 to 6, and R can be a methyl maximally containing 6 carbons. For the chemical formula as shown in FIG. 3A, in this embodiment, m and a are respectively 1 and 3, R is a methyl (indicated by Me in FIG. 3A), and molecular formula of the compound is $F(C_3HOF_4)nC_2F_4CH_2O(CH_1)_3Si(OMe)_3$. FIG. 3B illustrates a changed embodiment of the above formula, a OMe in FIG. 3A is replaced by $OSMe_2(CH_2)_2Si(OMe)_3$, and molecular formula of the fluorocarbon is $F(C_3HOF_4)nC_2F_4CH_2O(CH_2)_3Si(OMe)_3OSMe_2(CH_2)_2Si(OMe)_3$. Moreover, the fluorocarbon can also be $F(C_3HOF_4)nC_2F_4$—R, wherein R is $CONH(CH_2)_3Si(OMe)_3$, its chemical structural formula is as shown in FIG. 3C, and molecular formula is $F(C_3HOF_4)nC_2F_4CONH(CH_2)_3Si(OMe)_3$; R can also be $CONH(CH_2)_3SiMe_2OSMe_2(CH_2)_2Si(OMe)_3$, its chemical structural formula is as shown in FIG. 3D, and molecular formula is $F(C_3HOF_4)nC_2F_4CONH(C H_2)_3SiMe_2OSMe_2(CH_2)_2Si(OMe)_3$, but the fluorocarbon of the present disclosure is not limited hereto. The water-soluble conductive material can be any water-soluble conductive material such as conductive polymer, carbon nanotubes, Ag nanowires, or combinations thereof, but it is not limited thereto.

In addition, shape of the hydrophobic units 23 in the conductive film 21 of the touch panel can be adjusted as per design requirement. With reference to FIG. 4A to FIG. 4E, FIG. 4A to FIG. 4E are respectively schematic views of different shapes of hydrophobic units 23 in accordance with another embodiment of the present disclosure. As shown in FIG. 4A to FIG. 4E, different from the circle hydrophobic units 23 of FIG. 2A, shapes of the hydrophobic units 23 of FIG. 4A to FIG. 4E are respectively square, rectangle, rhombus, pentagon and hexagon.

Figure 5A:
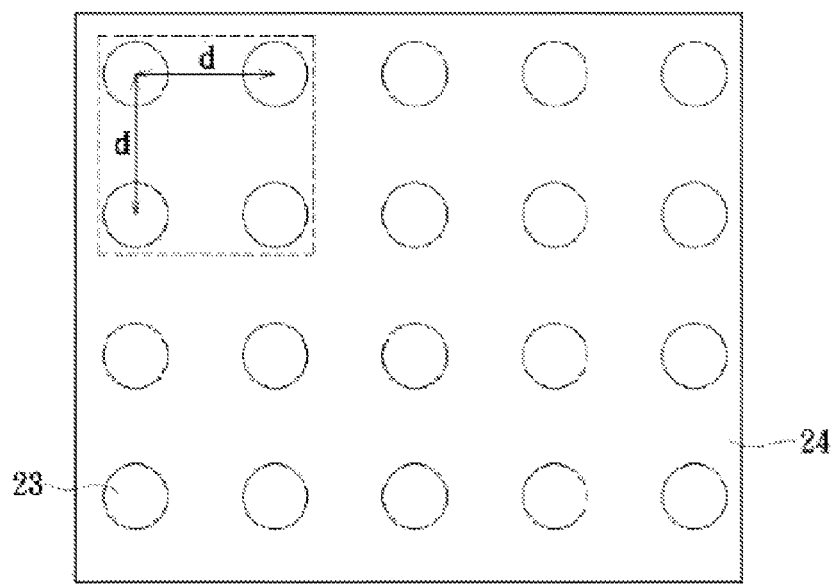
FIG. 5A to 5D are respectively schematic views of forming hydrophobic units on a substrate by different arrangement modes in accordance with another embodiment of the present disclosure.
Figure 5B:
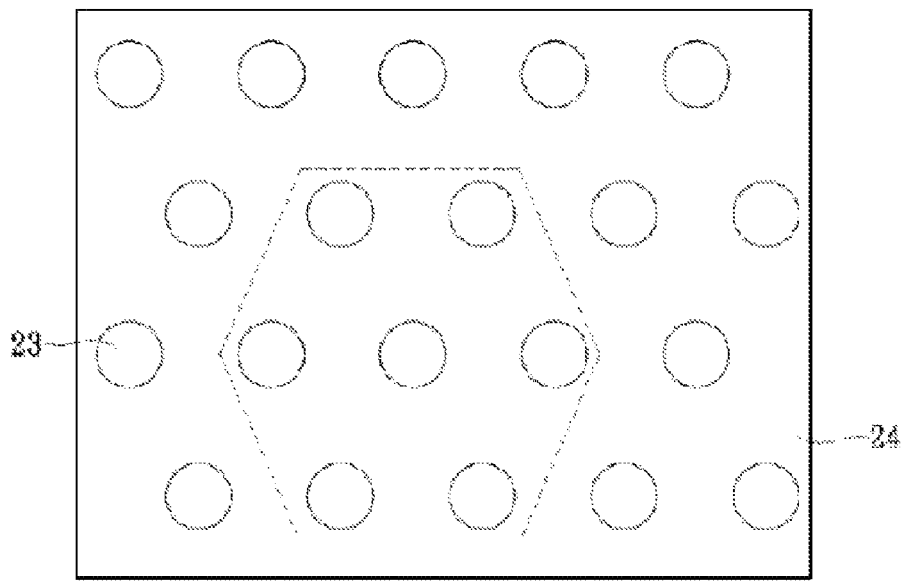
Figure 5C:
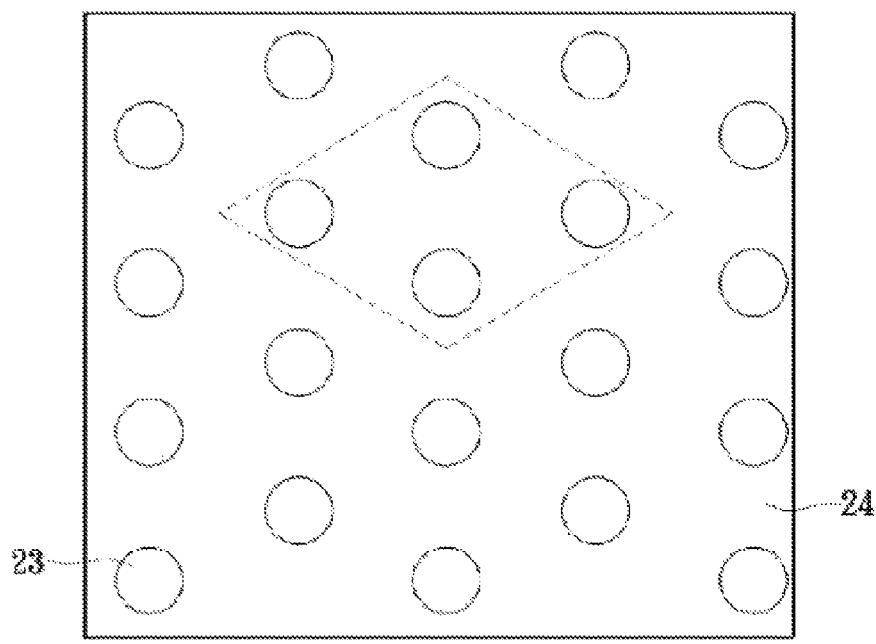
Figure 5D:
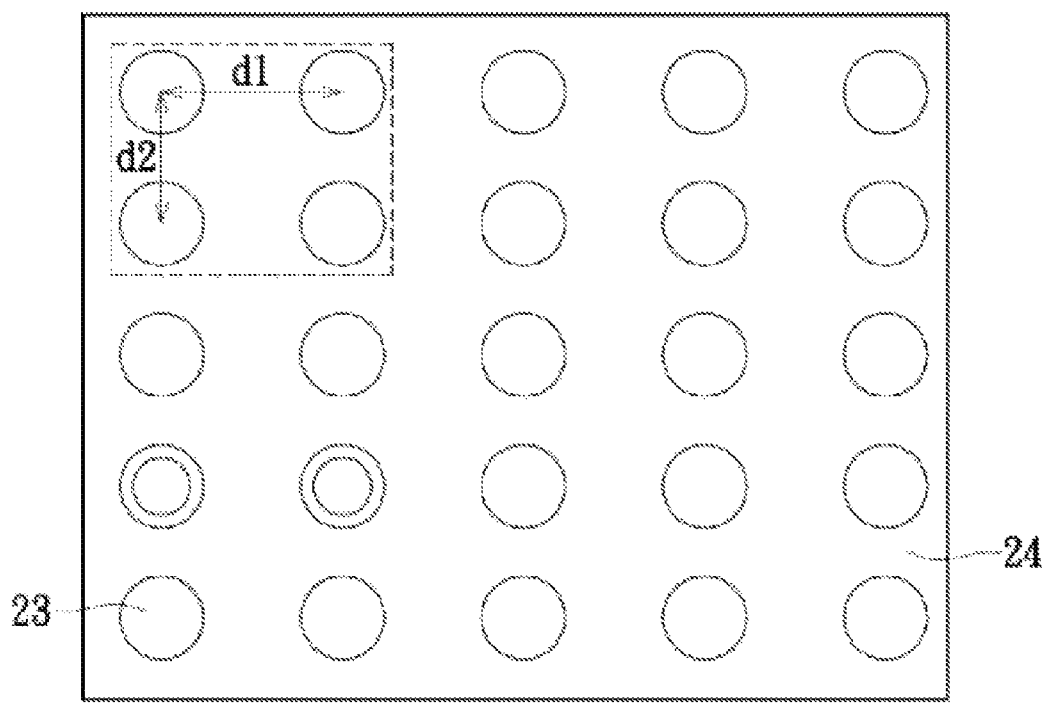

With reference to FIG. 5A to FIG. 5D, FIG. 5A to FIG. 5D are respectively schematic views of forming hydrophobic units 23 on a substrate by different arrangement modes in accordance with another embodiment of the present disclosure. As shown in FIG. 5A, the hydrophobic units 23 are respectively arranged in a square mode (distance of any two adjacent hydrophobic units 23 is d); as shown in FIG. 5B, the hydrophobic units 23 are respectively arranged in a hexagon mode; as shown in FIG. 5C, the hydrophobic units 23 are respectively arranged in a rhombus mode; as shown in FIG. 5D, the hydrophobic units 23 are respectively arranged in a rectangle mode (distance of two left-and-right adjacent hydrophobic units 23 is d1, distance of two up-and-down adjacent hydrophobic units 23 is d2, and d1 is not equal to d2).

It would be appreciated that, for the conductive film 21 of the touch panel of the present disclosure, the type of water-soluble conductive material, shape and arrangement mode of hydrophobic units 23, and the type of hydrophobic material are not limited. In addition, in another embodiment, a conductive film 21 of a touch panel further comprises a protective film (not shown in FIG. 2A, FIG. 2B and FIG. 2C) overlaid on a film 24, wherein the protective film is used as a protective layer of the touch panel for protecting the conductive film, and material and manufacturing process of the protective film are described in FIG. 6 in details.

Figure 6:
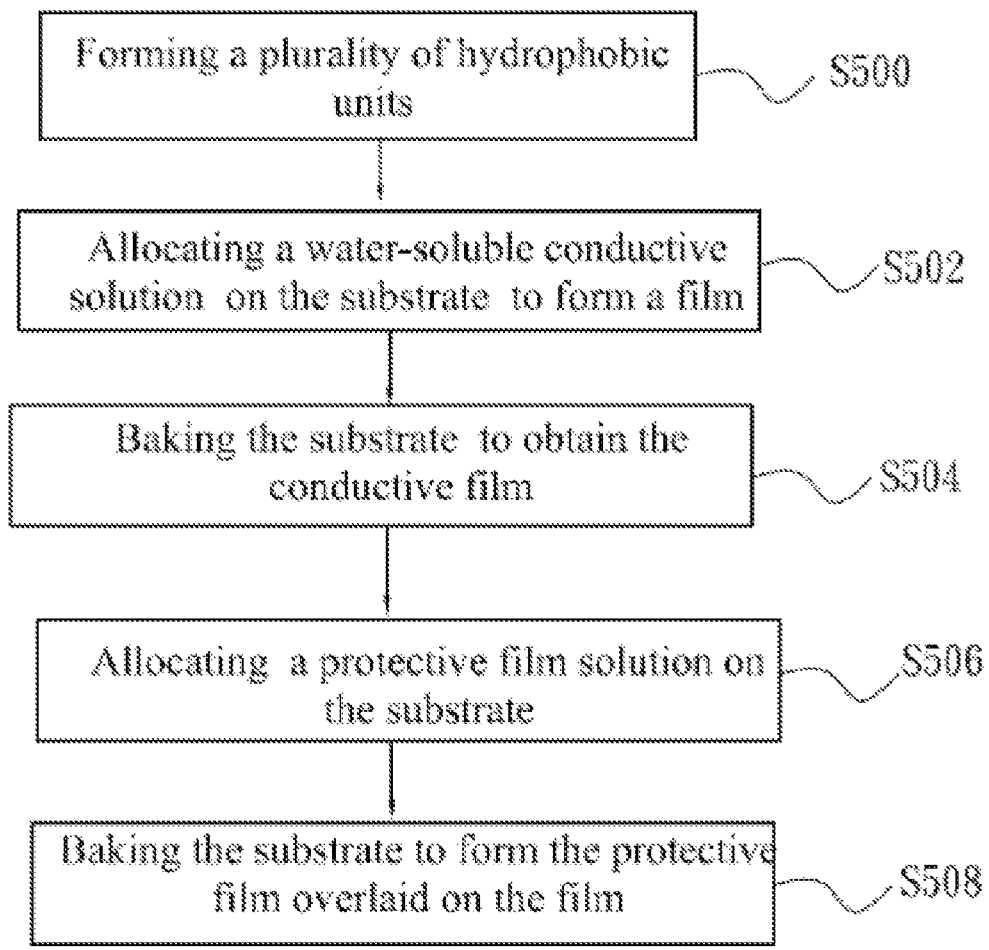
FIG. 6 is a flow chart of a method of manufacturing a conductive film of a touch panel in accordance with an embodiment of the present disclosure.

Further with reference to FIG. 6, FIG. 6 is a flow chart of a method of manufacturing a conductive film of a touch panel in accordance with an embodiment of the present disclosure. As shown in FIG. 6, step S500 includes forming a plurality of hydrophobic units 23 (for example, on a substrate 22 having a square arrangement mode, wherein shape of each hydrophobic unit 23 is circle). In particular, a hydrophobic material is overlaid on the substrate 22, and a plurality of hydrophobic units 23 are formed by a patterning process such as screen printing, inkjet printing or lithography/etching and the like. Step S502 includes allocating a water-soluble conductive solution containing a water-soluble conductive material such as carbon nanotube on the substrate 22 to form a film 24, wherein the hydrophobic units 23 are disposed in the film 24 with intervals. In particular, since the material of the hydrophobic units 23 is a hydrophobic material, the water-soluble conductive material can only cover the substrate 22 outside the region of the hydrophobic units 23, thereby forming the film 24. Step S504 includes baking the substrate 22 to obtain the conductive film 21 of the touch panel that is formed on the substrate 22.

In addition, in order to further protect the conductive film 21 of the touch panel, the method of manufacturing the conductive film of the touch panel further comprises steps S506 and S508. Step S506 includes allocating a protective film solution on the substrate 22. Step S508 includes baking the substrate 22 to form the protective film overlaid on the film 24. Material of the protective film comprises inorganic materials such as silicon nitride, silicon oxide, and silicon oxynitride, or organic materials such as acrylic resin or other applicable materials. Material, shape and arrangement mode of the hydrophobic units 23 and type of the water-soluble conductive material have already been disclosed in the foregoing description in details, and thus they are not described here again.

Figure 7:
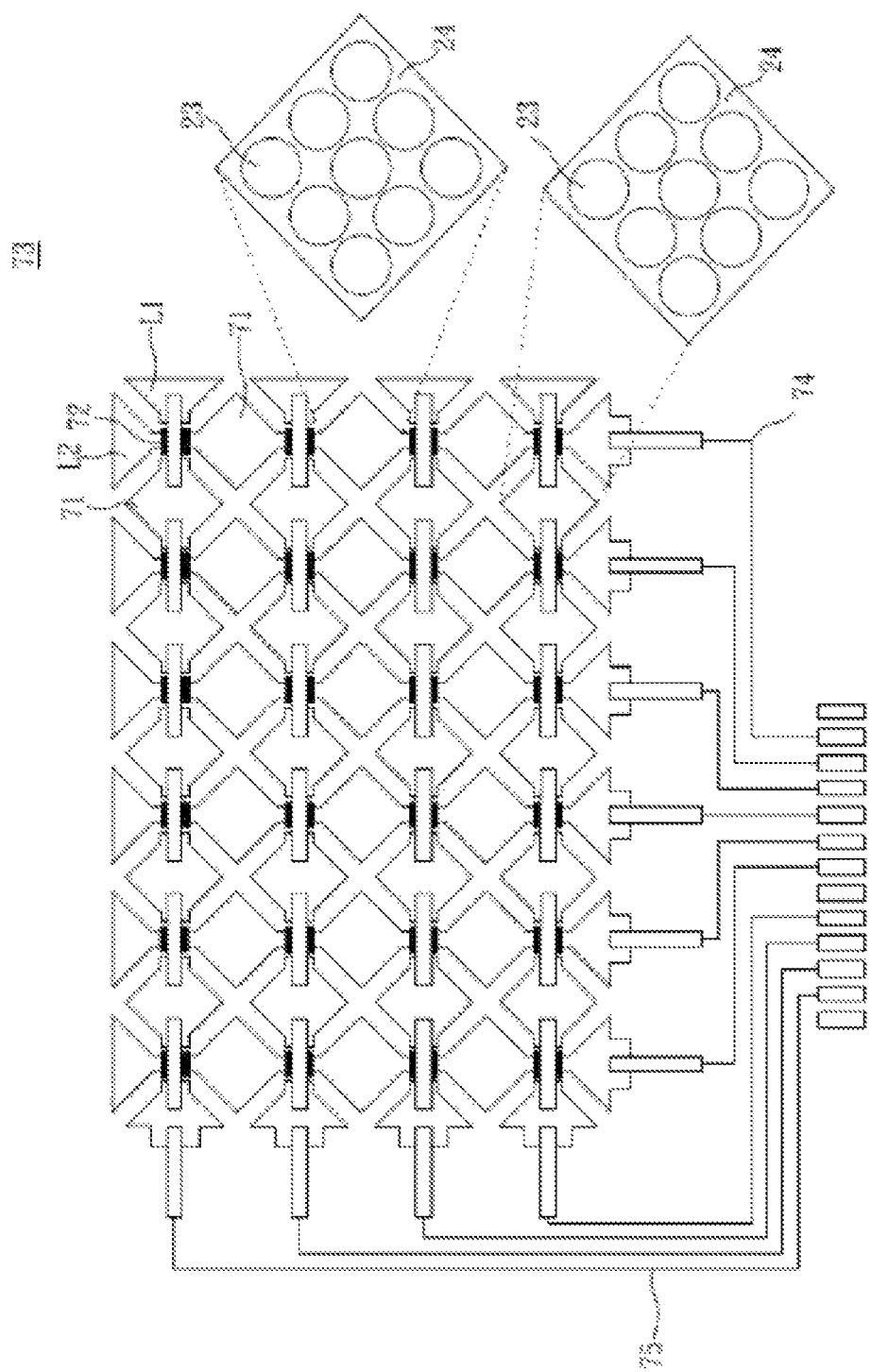
FIG. 7 is a plan view of a conductive film as an electrode layer of a touch panel in accordance with another embodiment of the present disclosure.

Further with reference to FIG. 7, FIG. 7 is a plan view of a conductive film as an electrode layer of a touch panel in accordance with another embodiment of the present disclosure. As shown in FIG. 7, in this embodiment, the conductive film of the touch panel is patterned by a lithography/etching process according to designed electrode patterns to form a plurality of electrodes 71. A plurality of hydrophobic units 23 are disposed in the electrodes 71 with intervals. The electrodes 71 comprise first electrode arrays L1 distributed along a first axis (such as X axis) and second electrode arrays L2 distributed along a second axis (such as Y axis), wherein the first electrode arrays L1 and the second electrode arrays L2 are insulated from each other by disposing insulating blocks 72 at the junctions. The first electrode arrays L1 are electrically connected with conducting wires 75, and the second electrode arrays L2 are electrically connected with conducting wires 74, so as to form an electrode layer 73 of the touch panel.

It is to be noted that, in FIG. 7, each of the electrodes 71 in the electrode layer 73 actually has a plurality of hydrophobic units 23 and a film 24 inside it, wherein the hydrophobic units are disposed in the film 24 with intervals (refer to an enlarged schematic view of the electrode 71 in FIG. 7), thereby making the electrode layer 73 have high light transmittance. In addition, shape of the foregoing electrode layer 73 can be adjusted as per actual requirement. In brief, shape of the electrode layer 73 is not for limiting the present disclosure.

Figure 8:
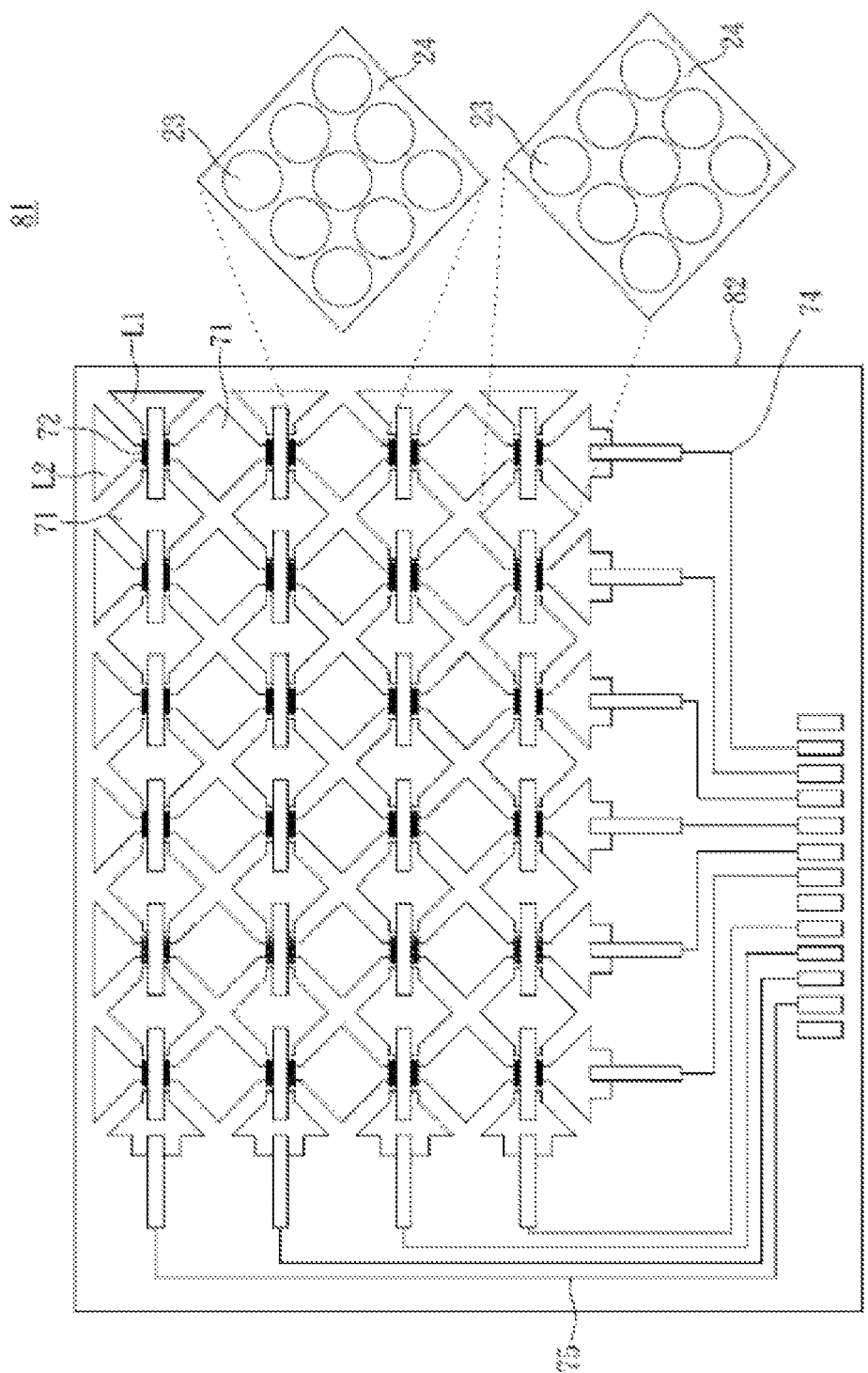
FIG. 8 is a plan view of a touch panel using a conductive film disclosed in the embodiment of the present disclosure.

Further with reference to FIG. 8, FIG. 8 is a plan view of a touch panel using a conductive film disclosed in the embodiment of the present disclosure. In FIG. 8, a touch panel 81 comprises a substrate 82 and an electrode layer 73 disposed on the substrate 82. The electrode layer 73 comprises a plurality of electrodes 71 which are formed of a patterned conductive film 21, and a plurality of hydrophobic units 23 are disposed in the electrodes with intervals, so that the touch panel 81 has high light transmittance and can sense users' touch. Since a plurality of hydrophobic units 23 are disposed in the conductive film 21, the touch panel 81 in this embodiment has good light transmittance to perform an excellent visual effect.

In addition, although the above embodiment of the present disclosure is to apply the conductive film to a touch panel, it is to be noted that application of the conductive film of the present disclosure is not limited hereto. All similarities to structure, manufacturing method or principle of the foregoing conductive film of the touch panel are within the scope of the present disclosure.

In conclusion, conductive material of the conductive film of the touch panel that is formed in accordance with the embodiments of the present disclosure is only distributed in the region without the hydrophobic units, and as the hydrophobic units have good light transmittance, the resultant touch panel of the present disclosure has a characteristic of high light transmittance.

In addition, since the conductive film of the touch panel is made of a conductive material with high conductivity, in contrast to a traditional ITO film, the conductive film of the touch panel has better conductivity. Also, in contrast to a traditional conductive film of a touch panel using a physical method for cutting or etching the conductive film so as to hollow out the conductive film and increase light transmittance of the conductive film, the manufacturing method of the conductive film of the touch panel in accordance with the embodiment of the present disclosure is relatively simple and easy with lower cost.

The foregoing descriptions are preferred embodiments of the present disclosure only. Various modifications can be made thereto without departing from the spirit and scope of the present disclosure. All modifications and substitutions to the claims of the present disclosure are defined by the attached claims.

What is claimed is:

1. A touch panel having a conductive film with high light transmittance, comprising:
    a substrate; and
    an electrode layer disposed on the substrate, wherein the electrode layer comprises:
        a plurality of electrodes each formed of a patterned conductive film;
        a plurality of conducting wires electrically connected with the electrodes; and
        a plurality of hydrophobic units disposed with intervals in-between in each of the electrodes to define a pattern of the patterned conductive film; wherein the patterned conductive film is made of a water-soluble conductive material, and the water-soluble conductive material covers the substrate outside the region of the hydrophobic units.

2. The touch panel of claim 1, wherein the electrodes comprise:
    first electrode arrays distributed along a first axis and second electrode arrays distributed along a second axis, wherein the first electrode arrays and the second electrode arrays are electrically insulated from each other, and wherein the first electrode arrays and the second electrode arrays are electrically connected with the plurality of conducting wires.

3. An electrode layer of a touch panel, comprising:
    a plurality of electrodes each formed of a patterned conductive film; and
    a plurality of hydrophobic units disposed with intervals in-between in each of the electrodes to define a pattern of the patterned conductive film; wherein the patterned conductive film is formed on a substrate; and the patterned conductive film is made of a water-soluble conductive material, wherein the water-soluble conductive material covers the substrate outside the region of the hydrophobic units.

4. The electrode layer of claim 3, wherein the electrodes comprise:
    first electrode arrays distributed along a first axis and second electrode arrays distributed along a second axis, wherein the first electrode arrays and the second electrode arrays are electrically insulated from each other.

5. A conductive film of a touch panel, comprising:
a film used for sensing touch signals; and
a plurality of hydrophobic units disposed in the film with intervals in-between to define a pattern; wherein the conductive film is formed on a substrate; and the film is made of a water-soluble conductive material, wherein the water-soluble conductive material covers the substrate outside the region of the hydrophobic units.

6. The conductive film of claim 5, wherein the film is a transparent film.

7. The conductive film of claim 5, wherein the hydrophobic units are made of a hydrophobic material.

8. The conductive film of claim 7, wherein the hydrophobic material is selected from a group consisting of anti-fingerprint coating, parting agent, release agent, silicone oil, and silicone.

9. The conductive film of claim 8, wherein the anti-fingerprint coating is a fluorocarbon.

10. The conductive film of claim 9, wherein general formula of the fluorocarbon is $F(C_3HOF_4)_nC_2F_4(CH_2)_mO(CH_2)_aSi(OR)_3$, wherein m and a can be an integer from 1 to 6, and R can be a methyl maximally containing 6 carbons.

11. The conductive film of claim 10, wherein the fluorocarbon is at least one of
$F(C_3HOF_4)_nC_2F_4CH_2O(CH_2)_3Si(OMe)_3$,
$F(C_3HOF_4)C_2F_4CH_2O(CH_2)_3Si(OMe)_3OSMe_2(CH_2)_2Si(OMe)_3$,
$F(C_3HOF_4)_nC_2F_4CONH(CH_2)_3Si(OMe)_3$ and
$F(C_3HOF_4)C_2F_4CONH(CH_2)_3SiMe_2OSMe_2(CH_2)_2Si(OMe)_3$.

12. The conductive film of claim 5, wherein shape of the hydrophobic units is selected from one or more of circle, square, rectangle, rhombus, pentagon, hexagon, or a combination thereof.

13. The conductive film of claim 5, wherein the film is made of a water-soluble conductive material.

14. The conductive film of claim 13, wherein the water-soluble conductive material is selected from a group consisting of conductive polymer, carbon nanotubes, and Ag nanowires.

* * * * *